United States Patent
Codding et al.

(10) Patent No.: US 7,025,891 B2
(45) Date of Patent: Apr. 11, 2006

(54) METHOD OF POLISHING C4 MOLYBDENUM MASKS TO REMOVE MOLYBDENUM PEAKS

(75) Inventors: Steven R. Codding, Underhill Center, VT (US); Timothy C. Krywanczyk, Essex Junction, VT (US); Joseph D. Danaher, Hinesburg, VT (US); John C. Malinowski, Jericho, VT (US); James R. Palmer, Hinesburg, VT (US); Melvin T. Kelly, Starksboro, VT (US); Caitlin W. Weinstein, Cambridge, MA (US); Wolfgang Sauter, Richmond, MA (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 10/604,991

(22) Filed: Aug. 29, 2003

(65) Prior Publication Data

US 2005/0045591 A1    Mar. 3, 2005

(51) Int. Cl.
   *B44C 1/22*    (2006.01)
   *C25F 3/00*    (2006.01)

(52) U.S. Cl. ........................................ 216/12

(58) Field of Classification Search ............ 216/12, 216/83, 88, 89; 430/4, 5; 438/942–952, 438/692, 693
See application file for complete search history.

(56) References Cited

U.S. PATENT DOCUMENTS

| 4,468,799 A |   | 8/1984  | Harms et al.              |
|-------------|---|---------|---------------------------|
| 4,603,056 A | * | 7/1986  | MacKinnon et al. ... 427/579 |
| 5,268,068 A | * | 12/1993 | Cowell et al. ......... 216/12 |
| 5,476,575 A | * | 12/1995 | Brophy et al. .......... 205/652 |
| 5,643,472 A | * | 7/1997  | Engelsberg et al. ..... 216/65 |
| 6,174,578 B1 | * | 1/2001  | Holley ................ 428/40.1 |

FOREIGN PATENT DOCUMENTS

| JP | 20011130     | 1/2000  |
| JP | 2001332517 A | 11/2001 |

* cited by examiner

*Primary Examiner*—Parviz Hassanzadeh
*Assistant Examiner*—Roberts Culbert
(74) *Attorney, Agent, or Firm*—Scully, Scott, Murphy & Presser, P.C.; William D. Sabo, Esq.

(57) ABSTRACT

A method of treating a molybdenum (moly) mask used in a C4 process to pattern C4 contacts. The moly mask has a wafer side which contacts a wafer during the C4 process and has a rough surface that includes spikes/projections of moly. The moly mask also has a non wafer side and a plurality of holes extending through the mask to pattern C4 contacts in the C4 process. An adhesive layer, such as an adhesive tape, is applied to the non wafer side of the moly mask, to enable a polishing tool to pull a vacuum on the non wafer side of the moly mask in spite of the presence of the holes to secure the moly mask during a subsequent polishing step. The tape also functions as a cushion so that defects on the non wafer side of the moly mask do not replicate through the moly mask to the polished wafer side of the moly mask. The wafer side of the moly mask is then subjected to mechanical or chemical/mechanical polishing to substantially remove the spikes of moly without significantly altering the dimensions of the moly mask or the holes.

13 Claims, 1 Drawing Sheet

METHOD OF POLISHING C4 MOLYBDENUM MASKS TO REMOVE MOLYBDENUM PEAKS

BACKGROUND OF INVENTION

1. Field of the Invention

The present invention relates generally to a method of polishing C4 molybdenum (moly) masks used to pattern the placement of C4 balls on wafers and chips. The method removes moly peaks and projections from the surface of the C4 moly masks that cause PMD (polyimide mechanical damage) with resultant chip yield loss and cracked final hard passivation which presents a reliability risk.

2. Discussion of the Prior Art

Molybdenum (moly) masks are placed on all wafers which use the C4 process prior to the metalization process that places the C4 contact balls on the wafers. The moly mask is fabricated with a pattern of holes through the mask which determines the pattern of C4 contact balls to be fabricated on the wafers and chips. Unfortunately, the photolithographic process used to create the pattern of holes through the mask also roughens the topography of the surface of the mask, creating spikes and etch pits in the moly surface. In the prior art, moly masks are typically manually worked with a smoothing stone or are rolled prior to usage. The surfaces of the moly masks produced by prior art rolling or stoning methods are not as controlled and smooth as moly masks produced pursuant to the present invention with polishing operations as described herein.

Molybdenum is used as the mask material for wafers in the C4 process as its coefficient of thermal expansion closely matches the coefficient of thermal expansion of the wafers it is masking. Typically, a 225 mm diameter moly mask having a thickness of 125 150 um is clamped onto a wafer having a diameter of 200 mm. Moreover, the moly masks are typically reused on a plurality of different wafers.

One problem with prior art moly masks is that PMD (polymide mechanical damage) is created in the top polymide level or layer of the wafer when the moly mask is clamped to the wafer. The heat cycles which the wafer and the mask are exposed to cause the sharp peaks on the moly mask to compromise the poly and the underlaying metal lines on the wafer.

SUMMARY OF INVENTION

The present invention provides a method of polishing C4 moly masks to remove moly peaks to minimize polyimide mechanical damage to wafers during the C4 process. A C4 moly mask has a plurality of holes extending through the mask to pattern C4 contacts on a wafer in the C4 process, and a wafer side of the moly mask contacts a wafer during the C4 process and has a rough surface that includes spikes of moly. An adhesive layer, such as an adhesive tape, is applied to the non wafer side of the moly mask, to enable a polishing tool to pull a vacuum on the non wafer side of the moly mask in spite of the presence of the holes for patterning of the C4 contacts. The tape also functions as a cushion so that defects on the non wafer side of the moly mask do not replicate through the moly mask to the polished wafer side of the moly mask. The wafer side of the moly mask is then subjected to mechanical or chemical/mechanical polishing to substantially remove the spikes of moly without significantly altering the dimensions of the moly mask or the holes.

BRIEF DESCRIPTION OF DRAWINGS

The foregoing objects and advantages of the present invention for a method of polishing C4 molybdenum masks to remove molybdenum peaks may be more readily understood by one skilled in the art with reference being had to the following detailed description of several embodiments thereof, taken in conjunction with the accompanying drawing which illustrates the major steps of the process of the present invention for polishing C4 moly masks to remove moly peaks.

DETAILED DESCRIPTION

Figure 1:
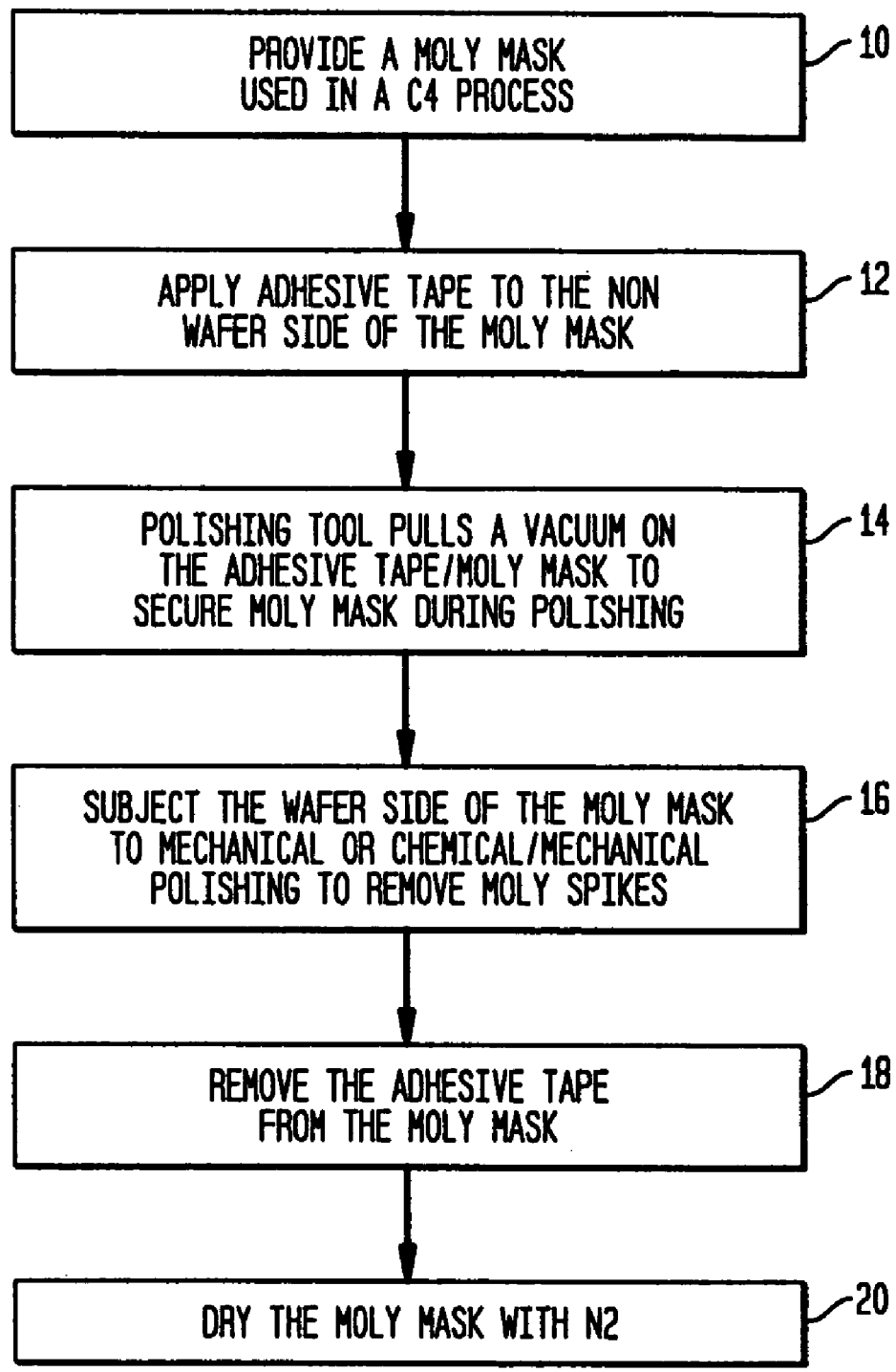

Pursuant to the present invention, moly masks are polished prior to clamping the moly masks to wafers. The drawing illustrates the major steps of the process of the present invention for polishing C4 moly masks used in a C4 process to pattern C4 contacts. At 10 a moly mask is provided having a wafer side which contacts a wafer during the C4 process and a rough surface that includes spikes of moly. The moly mask also includes a non wafer side and a plurality of holes extending through the moly mask to pattern C4 contacts in the C4 process. At 12 an adhesive layer is applied to the non wafer side of the moly mask. This enables a polishing tool to apply a vacuum to the non wafer side of the moly mask/adhesive layer at 14 to secure the moly mask during a further polishing step despite the presence of the holes through the mask. At 16 the wafer side of the moly mask is polished with a polishing compound/slurry to substantially remove the spikes of moly without significantly altering the dimensions of the moly mask or the holes. The polishing compound is then removed and cleaned from the moly mask/adhesive layer, and at 18 the adhesive layer is removed from the moly mask. At 20 the moly mask is dried with N2.

In a preferred embodiment, an adhesive tape is applied to the non wafer side of the moly mask to enable a polishing tool to pull a vacuum on the non wafer side of the moly mask in spite of the presence of the holes for patterning of the C4 contacts. The tape also functions as a cushion so that defects on the non wafer side of the moly mask do not replicate through the moly mask to the polished wafer side of the moly mask.

A UV deactivated tape can be employed in the process, and after cleaning the polishing compound from the moly mask/adhesive tape, the UV adhesive tape is exposed to a UV source to deactivate the UV tape, and the UV tape is then removed from the moly mask. Alternatively, a strip of pressure sensitive tape can be applied to the non wafer side of the moly mask.

The wafer side of the moly mask can be subjected to mechanical polishing to substantially remove the spikes of moly without significantly altering the dimensions of the moly mask or the holes. The mechanical polishing can use a polishing silica based slurry in potassium hydroxide having a pH at which the moly is stable which results is only mechanical polishing. Alternatively, the polishing can include chemical/mechanical polishing of the wafer side of the moly mask to substantially remove the spikes of moly with a slightly higher risk of altering the dimensions of the moly mask or the holes. The chemical/mechanical polishing can use a polishing silica based slurry having potassium hydroxide HNO3 (nitric acid) added thereto to provide chemical/mechanical polishing.

The polishing can employ a polishing compound having abrasives with a hardness >5.5 on the Mohs scale, such as abrasives selected from the group of Al2O3, BaCO3, and Cerium oxides.

The following is a detailed step by step description of the processes of the present invention.

Step 1. A backside grinding adhesive such as a layer of adhesive or preferably an adhesive tape is applied to the non wafer contacting side of the moly mask. The tape must have a sufficiently strong adhesion strength to remain adhered to the moly mask during the polishing cycle.

The purpose of this step is to enable the polishing tool to pull a vacuum on the non wafer side of the moly mask, while considering that the holes for patterning of the C4 contacts are present in the moly mask and otherwise would dissipate the vacuum.

Secondly, the adhesive or adhesive tape also acts as a cushion so that defects on the non wafer side of the moly mask do not replicate through the mask to the polished wafer side of the moly mask.

Step 2. Polish the moly mask, typically for approximately 5 minutes.

A polishing slurry SC112, commercially available from Cabot Corp. or Rodel Corp., can be used which is a silica based slurry pH=10 in KOH (potassium hydroxide) having a Mohs hardness of 6.5. Since molybdenum is stable in KOH at this pH, the result is only mechanical polishing, not CMP (chemical/mechanical polishing), and accordingly the hole sizes will not change.

HNO3 (nitric acid) could be added to the slurry to increase the polishing rate, which would result in a CMP (chemical/mechanical polishing) process.

Other abrasives, other than SC112, with a hardness >5.5 on the Mohs scale (Al2O3, BaCO3, Cerium oxides) might also be suitable abrasive candidates.

Step 3. Detape the molybdenum mask. If a UV tape is used, which can be deactivated by exposure to UV, first expose the moly mask/UV cured tape to a UV source to deactivate the tape, and then remove the UV tape. Such UV tapes can have an adhesion pressure of approximately 300 grams/inch, and after deactivation can have an adhesion pressure of approximately 5 grams/inch. Such UV tapes are commercially available from Furakawa, a Japanese company. If a pressure sensitive tape is used, peal the tape. Pressure sensitive tapes are commercially available from Mitsui, a Japanese company, SB135H or SB370SV.

Step 4. Dry off the moly mask with N2.

The final surface roughness of moly masks produced by polishing operations pursuant to the present invention can be determined by the parameters employed in the polishing processes.

While several embodiments and variations of the present invention for a method of polishing C4 molybdenum masks to remove molybdenum peaks are described in detail herein, it should be apparent that the disclosure and teachings of the present invention will suggest many alternative designs to those skilled in the art.

The invention claimed is:

1. A method of treating a molybdenum (moly) mask used in a C4 process to pattern C4 contacts, comprising:
   providing a moly mask used in the C4 process, the moly mask having a wafer side which contacts a wafer during the C4 process and which has a rough surface that includes projections of moly, a non wafer side, and a plurality of holes extending through the moly mask to pattern C4 contacts in the C4 process;
   applying an adhesive layer to the non wafer side of the moly mask;
   subjecting the non wafer side of the moly mask/adhesive layer to a vacuum;
   polishing the wafer side of the moly mask with a polishing compound to substantially remove the projections of moly without significantly altering the dimensions of the moly mask or the holes.

2. The method of claim 1, further including cleaning the polishing compound from the moly mask/adhesive layer, and removing the adhesive layer from the moly mask.

3. The method of claim 1, wherein the step of applying includes applying an adhesive tape to the non wafer side of the moly mask to enable a polishing tool to pull a vacuum on the non wafer side of the moly mask while the holes for patterning of the C4 contacts are present in the moly mask, and the tape also functioning as a cushion so that defects on the non wafer side of the moly mask do not replicate through the moly mask to the polished wafer side of the moly mask.

4. The method of claim 3, further including cleaning the polishing compound from the moly mask/adhesive tape, and removing the adhesive tape from the moly mask.

5. The method of claim 3, wherein the step of applying includes applying a UV deactivated tape to the non wafer side of the molybdenum mask.

6. The method of claim 5, further including cleaning the polishing compound from the moly mask/adhesive tape, exposing the moly mask/adhesive tape to a UV source to deactivate the UV tape, and then removing the UV tape.

7. The method of claim 3, wherein the step of applying includes applying an adhesive strip of pressure sensitive tape to the non wafer side of the moly mask.

8. The method of claim 1, wherein the step of polishing includes mechanical polishing of the wafer side of the moly mask to substantially remove the projections of moly without significantly altering the dimensions of the moly mask or the holes.

9. The method of claim 8, wherein the step of polishing uses a polishing silica based slurry in potassium hydroxide having a pH at which the moly is stable, to result in only mechanical polishing.

10. The method of claim 1, wherein the step of polishing includes chemical/mechanical polishing of the wafer side of the moly mask to substantially remove the spikes of moly without significantly altering the dimensions of the moly mask or the holes.

11. The method of claim 10, wherein the step of polishing uses a polishing silica based slurry having potassium hydroxide and HNO3 (nitric acid) to provide chemical/mechanical polishing.

12. The method of claim 1, wherein the step of polishing includes polishing with a polishing compound having abrasives with a hardness >5.5 on the Mohs scale.

13. The method of claim 12, wherein the step of polishing includes polishing with a polishing compound having an abrasive selected from the group of Al2O3, BaCO3, and Cerium oxides.

* * * * *